United States Patent [19]

Avery

[11] Patent Number: 4,633,283

[45] Date of Patent: Dec. 30, 1986

[54] CIRCUIT AND STRUCTURE FOR PROTECTING INTEGRATED CIRCUITS FROM DESTRUCTIVE TRANSIENT VOLTAGES

[75] Inventor: Leslie R. Avery, Huntedon County, N.J.

[73] Assignee: RCA Corporation, Princeton, N.J.

[21] Appl. No.: 710,271

[22] Filed: Mar. 11, 1985

[51] Int. Cl.[4] .............................................. H01L 29/78
[52] U.S. Cl. .................................... 357/23.13; 357/13; 357/39; 357/35; 361/56; 361/91
[58] Field of Search ................... 357/23.13, 38, 39, 44, 357/35, 13; 361/56, 91

[56] References Cited

U.S. PATENT DOCUMENTS

| | | | |
|---|---|---|---|
| 3,573,550 | 3/1969 | Baker, Jr. | 317/16 |
| 4,377,832 | 3/1983 | Toney et al. | 361/56 |
| 4,400,711 | 8/1983 | Avery | 361/56 |
| 4,484,244 | 11/1984 | Avery | 361/56 |

FOREIGN PATENT DOCUMENTS

| | | |
|---|---|---|
| 2951421 | 9/1980 | Fed. Rep. of Germany . |
| 54-116887 | 9/1979 | Japan ................... 357/23.13 |

OTHER PUBLICATIONS

G. Feth et al., "Planar Triac Structures", IBM Tech. Discl. Bull, vol. 19 #6, Nov. 1976, pp. 2297-2301.
D. Goldthorp et al., "Integ. Ckt. Comp. PNPN Diode", 1979 IEDM, Ch 1504, pp. 180-183.

*Primary Examiner*—Joseph E. Clawson, Jr.
*Attorney, Agent, or Firm*—Birgit E. Morris; Donald S. Cohen; Henry Steckler

[57] ABSTRACT

A protection circuit comprises first and second circuit to respectively protect an IC against negative and positive going transients in an input signal. If the input includes a repetitive signal greater than a threshold for firing the negative going protection circuit, substrate current injection and signal clamping will result. To prevent this, the first circuit includes an emitter-base shunt resistor and a Zener diode coupled to a pair of opposite conductivity type transistors to lower the threshold thereof. Each of the circuits comprises a pair of opposite conductivity type transistors formed in a single isolated region, which in turn is formed in an opposite conductivity type substrate.

12 Claims, 6 Drawing Figures

CIRCUIT AND STRUCTURE FOR PROTECTING INTEGRATED CIRCUITS FROM DESTRUCTIVE TRANSIENT VOLTAGES

BACKGROUND OF THE INVENTION

The present invention relates to a circuit and a semiconductor structure for protecting integrated circuits, and more particularly, to a circuit and structure used to protect an integrated circuit (IC) from transient voltages while, for example, the IC receives a television syncrhonizing (sync) pulse of negative amplitude greater than the base-emitter turn-on voltage.

In my U.S. Pat. No. 4,484,244, which issued on Nov. 20, 1984, incorporated herein by reference, I dislcose a dual polarity electrostatic discharge protection means for an IC, the protection means being formed in an isolated region of the chip on which the IC is formed. In particular, individual protection circuits are provided for protection against positive and negative transients, respectively. Each protection circuit comprises a pair of opposite conductivity type transistors arranged as a two terminal silicon controlled rectifier (SCR). The composite structure consisting of all the circuit elements shown in said patent is formed within an "N-boat" or well, which is formed in an N$^-$ epitaxial layer on a P$^-$ substrate and is surrounded by a P$^+$ doped region which provides isolation.

The transient protection provided by the protection means shown in U.S. Pat. No. 4,484,244 was designed to be activated when any signal exceeded the IC supply potentials. DC-coupled signals from other ICs in the system lie within the triggering thresholds imposed by the ground and supply potentials so that the protection means remains in the OFF (non-conducting) state. However, if AC-coupling is used for circuit/system reasons, the effective signal potentials can be shifted outside the ground or supply reference voltages. For example, if a composite video signal is AC-coupled to the IC, the negative-going sync tip can be several volts negative. If the protection means of U.S. Pat. No. 4,484,244 is included as part of the input circuit, the negative trigger threshold would be exceeded, turning the protection circuit ON (causing the protection means to conduct). This would cause DC restoration of the signal with the sync tip having a final potential which causes the negative transient protection circuit to conduct at approximately 0.7 volts (one $V_{BE}$, the base emitter voltage) below the ground reference potential. Repetitive clamping of the signal may be undesirable for system reasons and can also cause undesired substrate current injection which could disturb the normal operation of other circuits on the same chip. In particular, forward biasing of the diode formed by the N-boat region and the P- substrate causes electron current to flow underneath the isolation region into the substrate. This current is attracted by adjacent positively biased N-boats, thereby disturbing the operation of active devices formed within the adjacent N-boats. Although the normal operation of the circuits would also be disturbed by a transient, caused for example by picture tube flashover, this is a rare event, and not synchronized and repetitive as in the case of sync pulses.

Modification of the protection means described in U.S. Pat. No. 4,484,244 to enable the negative firing threshold to be extended to several volts below (negative) ground, while maintaining full protection against undesired transients which exceed the new threshold, is described herein.

SUMMARY OF THE INVENTION

A circuit in accordance with the invention comprises first and second circuits formed in a single isolated semiconductor region for protecting an integrated circuit against negative and positive-going transients, respectively. Each of the circuits comprises a pair of coupled, opposite conductivity type transistors. The first circuit also comprises a shunt resistor coupled to the emitter and base of one of said transistors and a Zener diode coupled between a source of input signals and the transistors of the first circuit. This resistor prevents conduction of the first circuit, and hence input signal clipping and substrate current injection, for negative transients having a magnitude less than the negative breakdown voltage of the diode.

A structure in accordance with the invention comprises a substrate and a region of opposite conductivity type at the surface of the substrate. A first pair of opposite conductivity type transistors, an emitter-base shunt resistor, and a Zener diode are formed in the isolated region and comprise a first circuit for negative transient protection. Further, a second pair of opposite conductivity type transistors are also formed in this region and comprise a second circuit for positive transient protection.

DETAILED DESCRIPTION OF PREFERRED EMBODIMENTS

Figure 1:
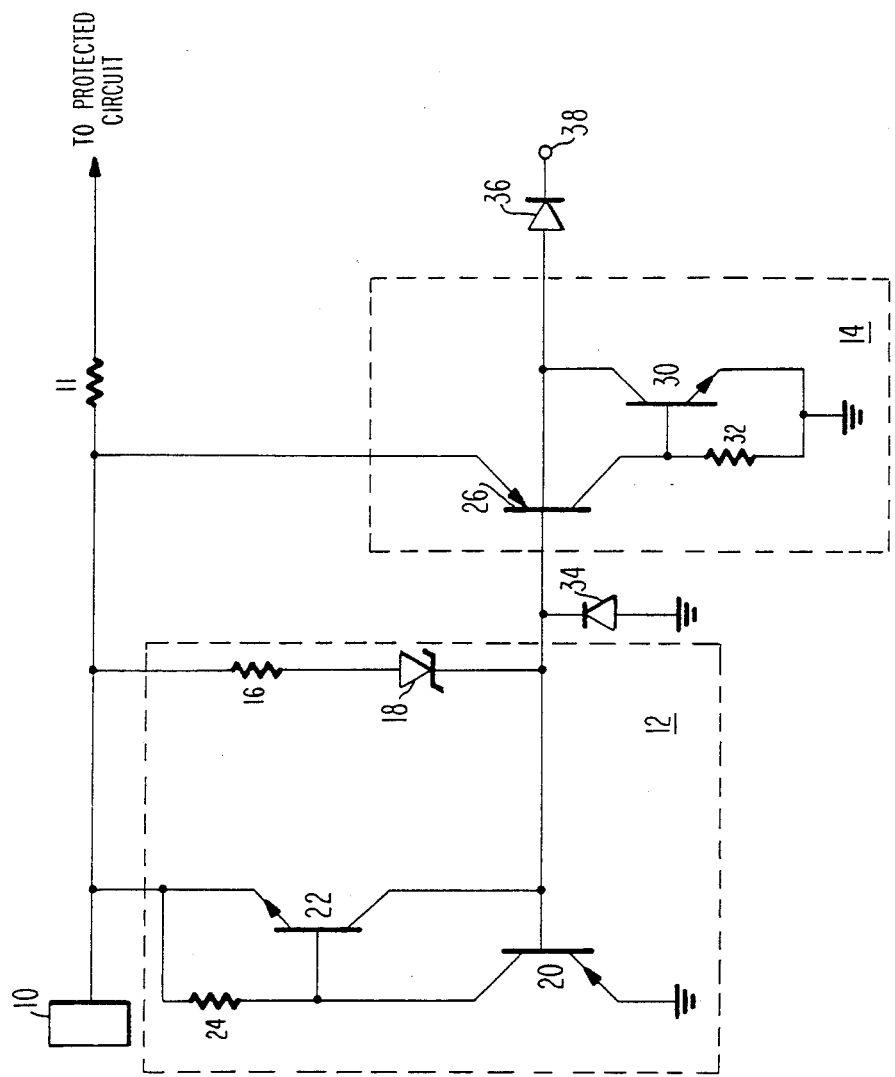
FIG. 1 is a schematic diagram of a protection circuit in accordance with the invention.

FIG. 1 shows an input pad or signal input terminal 10 that receives a composite video signal having negative-going sync signals. The composite signal is applied through a current limiting resistor 11 to a protected circuit (not shown) formed on the same chip. Coupled to the pad 10 is a circuit 12 that safeguards the protected circuit from negative-going transients and a corresponding circuit 14 that safeguards against positivegoing transients.

The negative-going protection circuit 12 of the present invention, as distinct from the corresponding circuit of U.S. Pat. No. 4,484,244, comprises a current limiting resistor 16 having a resistance of about 1.5KΩ coupled to pad 10, and a Zener diode 18 having an anode coupled to resistor 16. The diode 18 has a breakdown voltage of about −10 volts. The cathode of the diode 18 is coupled to the base of a PNP transistor 20, which has an emitter coupled to a first reference potential (ground in this embodiment). The cathode of the diode 18 is also coupled to the collector of an NPN transistor 22, which has a base coupled to the collector of the transistor 20. The base of the transistor 22 is also coupled through a first emitter-base shunt resistor 24 to the pad 10, while the emitter of the transistor 22 is directly connected to the pad 10. The combination of the Zener diode 18 and the first shunt resistor 24 is sufficient to avoid triggering by negative-going signals, which typically have an amplitude of about −3 volts.

The positive-going protection circuit 14 comprises a PNP transistor 26 having an emitter coupled to the pad 10 and to the resistor 11. The base of the transistor 26 is coupled to the cathode of the diode 18. The base and collector of the transistor 26 are coupled to the collector and base respectively of an NPN transistor 30. The emitter of the transistor 30 is directly coupled to the first reference potential, while the base thereof is coupled to the first reference potential through a second emitter-base shunt resistor 32.

Figure 2:
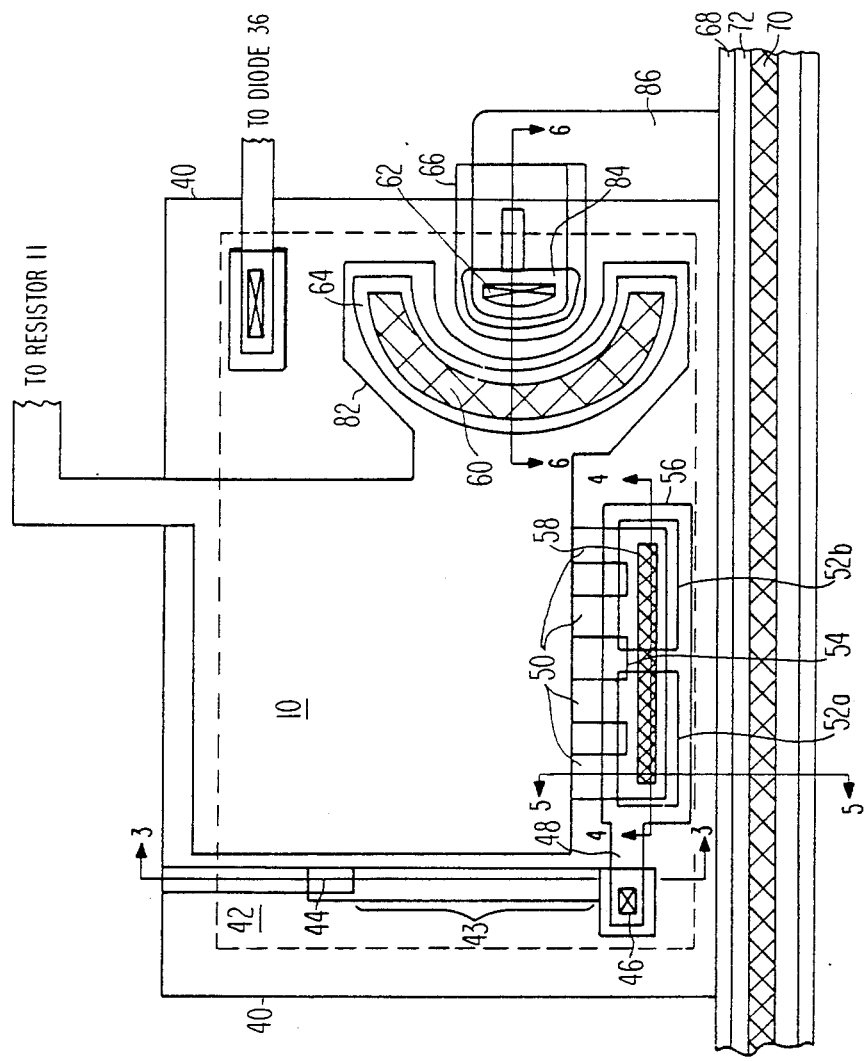
FIG. 2 is a plan view of a structure of the circuit of FIG. 1.

Common to the circuits 12 and 14 is a first diode 34 having its anode coupled to ground. The cathode of the first diode 34 is coupled to the cathode of the Zener diode 18, the base of transistor 20, the base of the transistor 26, the collector of the transistor 30, and the anode of a second diode 36. The cathode of the second diode 36 is connected to a terminal 38 that is a second source of reference potential which is normally $V_{cc}$, the positive operating supply voltage of the IC. The firing threshold voltage of the circuit 14 can be changed by adjusting the voltage at the terminal 38. Resistor 11 is not connected across the emitter-base junction of the transistor 26 (as shown in FIG. 2 of said U.S. Pat. No. 4,484,244) since such connection would be in parallel with the Zener diode 18 and the resistor 16 and would cause the threshold level to be that of the original circuit. However, in the present invention, the current limiting resistor 11 also serves to enable the measurement of the voltage at the pad 10 with respect to the second reference voltage at the terminal 38.

Initially transistors 26 and 30 of the positive-going protection circuit 14 are OFF (non-conducting) with the second shunt resistor 32 preventing electrical and thermal noise from switching the transistors ON (conducting). When a positive going transient having a voltage which exceeds the $V_{cc}$ potential at the terminal 38 by greater than $2V_{BE}$ (+1.4 volts) occurs, current flows through the emitter-base junction of the transistor 26 and also through the second diode 36. This emitter current in the transistor 26 causes a collector current to flow in the transistor 26 and the resistor 32. If this current is sufficient to cause a voltage equal to $V_{be}$ (about 0.7 volts) across the second shunt resistor 32, the transistor 30 will conduct thereby causing additional base current to flow in the transistor 26, thereby driving it further into the ON state. This positive feedback effect causes saturation of the transistors 26 and 30, thereby effectively clamping the pad 10 to about the first reference potential (ground). The second diode 36 is then reverse biased and thus only serves as a triggering aid for the positive-going protection circuit 14. The first diode 34 is reverse biased during this operation.

Initially, the transistors 20 and 22 of the negative-going protection circuit 12 are OFF. The first emitter-base shunt resistor 24 prevents triggering due to a high rate of voltage change with time (dv/dt) which can occur at the edges of the negative-going sync signals. When the voltage on the pad 10 goes negative by at least the 10 volt breakdown voltage of Zener diode 18, e.g. as a result of an electrostatic discharge or level shifts due to AC-coupling, current flows from ground through the first diode 34, the Zener diode 18, and the resistor 16. The current in the first diode 34 causes emitter-collector current to flow in the transistor 20 since the first diode 34 and the transistor 20 form a current mirror. Thus current flows through the first shunt resistor 24 causing a voltage drop thereacross. When this voltage drop is equal to one $V_{be}$ (about 0.7 volts), the transistor 22 turns ON causing additional base current to be injected into the transistor 20, thereby causing it to be further driven into the ON state. This positive feedback drives the transistors 20 and 22 into saturation, which clamps the pad 10 to ground potential. Thus the circuit 12 is a two terminal silicon controlled rectifier with the Zener diode 18 providing a negative threshold of greater magnitude to eliminate the possibility of sync tip clamping and substrate current injection with normal amplitude negative-going sync signals. Thus repetitive clamping and hence repetitive substrate current injection is eliminated. Since the transistor 26 and the second diode 36 only turn ON with positive-going signals, they are OFF during the above-described operation of the circuit 12 and, therefore, do not effect the operation thereof.

In FIGS. 2–6 various view of the circuit of FIG. 1 in IC form are shown. The structure is similar to that shown in my aforementioned U.S. Pat. No. 4,484,244 so the emphasis herein will be on the differences from said patent.

Referring now to FIG. 2, it will be seen that most of the area is occupied by pad 10 and that a P+ region 40, which provides isolation, surrounds an N-boat or well 42 containing the protection circuits 12 and 14 and the diode 34. The resistor 16 and the Zener diode 18 are formed within the N-boat 42 to the left (as shown in FIG. 2) of the pad 10. In particular, a P region 43 forms the resistor 16. One end of the P region 43 overlays and contacts a P+ region 44, which forms the anode of the Zener diode 18. A contact opening 46 at the bottom of FIG. 2 allows the other end of the P region 43 to be connected to the pad 10 via metallizations 48 and 50.

The modified negative transient protection circuit 12 is formed adjacent to the pad 10, as in said patent. A difference between this structure and that of said patent is that the N+ emitter region 52 is divided into two spaced portions 52a and 52b by a gap portion 54 to allow contact to the P region 56. The gap portion 54 serves to allow contact to the expanded base of the transistor 22, the collector of the transistor 20, and the emitter-base shunt resistor 24, as is explained below. A contact opening 58 overlays the two emitter portions 52(a) and 52(b) and the gap region 54. At the right of FIG. 2 are contact openings 60 and 62, P regions 64 and 66, metallizations 82 and 86, and an N+ region 84. At the bottom of FIG. 2 is a P region 68 having a contact opening 70 and a metalization 72 thereon.

Figure 3:
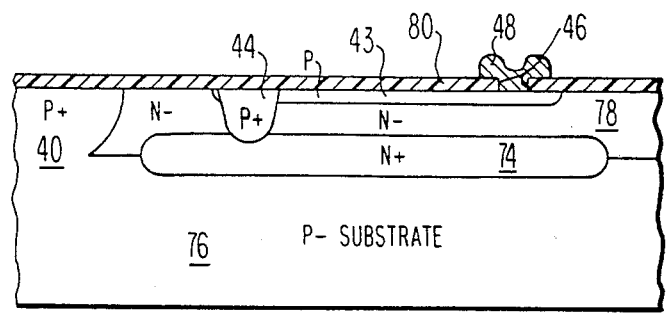
FIG. 3 is a cross-sectional view taken along the line 3—3 of FIG. 2.

Referring to FIG. 3 a cross-section of the structure on lines 3—3 of FIG. 2 is shown. An N+ buried region 74 is formed on a P− substrate 76. An N− epitaxial region or layer 78 is grown on both the substrate 76 and the buried region 74, and isolated by the P+ isolation region 40 to form the N-boat 42 shown in FIG. 2. A P+ region 44 forms the anode and the N+ buried region 74 forms the cathode of the Zener diode 18. The separate P region 43 is used to form the resistor 16. One end of this region extends over the P+ region 44, and makes electrical contact to it. Contact to the other end of the resistor 16 is made by the metallization 48, through the contact opening 46 in an overlying insulating layer 80.

Figure 4:
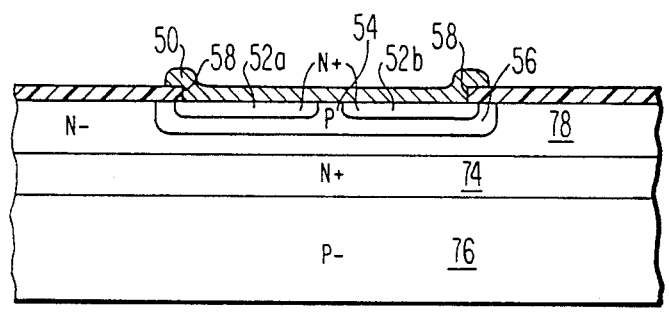
FIG. 4 is a cross-sectional view taken along the line 4—4 of FIG. 2.

FIG. 4 shows a cross-section of the structure along line 4—4 of FIG. 2. The P− substrate 76, the N+ buried region 74 and the N⁻ epitaxial layer 78 are common to the whole structure. The P region 56 forms the base of the transistor 22, the collector of the transistor 20 and the emitter-base shunt resistor 24. The N+ emitter region 52 comprises the emitter of the transistor 22. The metallization 50 contacts the base of the transistor 22, the collector of the transistor 20 and the first shunt resistor 24 at the gap portion 54. In addition, the metalization 50 contacts the N+ emitter region 52 of the transistor 22 at the contact opening 58.

Figure 5:
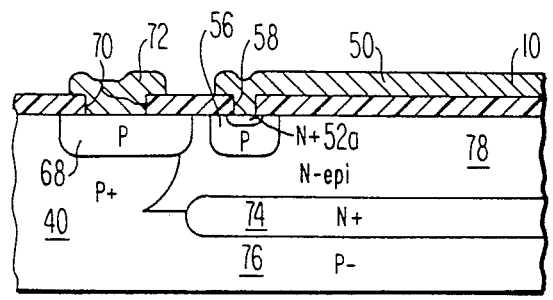
FIG. 5 is a cross-sectional view taken along the line 5—5 of FIG. 2.

FIG. 5 shows a cross-section of the structure of the negative-going protection circuit 12 along line 5—5 of FIG. 2. The NPN transistor 22 comprises the N+ portion 52a (emitter), the P region 56 (base), and the N region 78 (collector). The PNP transistor 20 comprises the P region 68 (emitter), which contacts the P+ isolation region 40 and hence the P— substrate 76, the N layer 78 (base), and the P region 56 (collector). Since the layer 78 is common to the collector of the transistor 22 and the base of the transistor 20, they are connected. Similarly, since the P region 56 is common to the base of the transistor 22 and the collector of the transistor 20, they are also connected.

Figure 6:
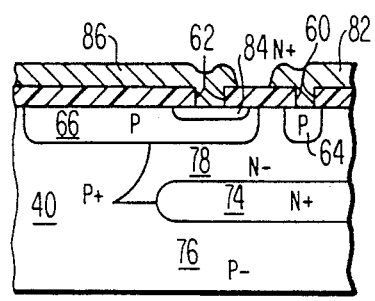
FIG. 6 is a cross-sectional view taken along line 6—6 of FIG. 2.

FIG. 6 shows a cross-section of the structure of the positive-going protection circuit 14 taken along line 6—6 of FIG. 2. The PNP transistor 26 comprises the P region 64 (emitter) connected to the bond pad 10 by the metalization 82, the N⁻ layer 78 (base), and the P region 66 (collector). Similarly, the NPN transistor 30 comprises the N+ region 84 (emitter), connected to the P⁻ substrate 76 (ground) by the metalization 86, the P region 66 (base), and the N⁻ layer 78 (collector). The P region 66 also comprises the second shunt resistor 32. Since the N⁻ epitaxial layer 78 is common to the base of the transistor 26 and the collector of transistor 30, they are connected. Similarly, since the P region 66 is common to the collector of the transistor 26 and the base of the transistor 30, they are also connected.

The first diode 34 comprises the P⁻ substrate 76 (anode) and the N+ buried region 74 (cathode), which contacts the N⁻ epitaxial layer 78. The second diode 36 is external to the structure shown in FIGS. 2-6 and is, therefore, not shown therein.

The structure which embodies the circuit is thus comprised of a substrate 76 of a first conductivity type, a first region 78 of a second conductivity type, a second region 74 of the second conductivity type, a third region 43 of the first conductivity type, a fourth region 44 of the first conductivity type, a fifth region 52 of the second conductivity type, a sixth region 56 of the first conductivity type, a seventh region 68 of the first conductivity type, an eighth region 64 of the first conductivity type, a ninth region 66 of the first conductivity type, and a tenth region 84 of the second conductivity type.

The two conductivity types in the regions can be achieved by known methods such as ion implantation, doped oxides, or vapor deposition or a combination thereof of the appropriate conductivity modifying substances.

It will be appreciated that a pair of protection circuits for respectively protecting a protected circuit against positive and negative-going transients is formed in a common N-boat or well with the negative-going circit featuring a Zener diode in combination with an emitter-base shunt resistor to lower (make more negative) the threshold thereof, and hence lower the level at which substrate current injection occurs. Further, if the input signal comprises a composite video signal, the present invention prevents clamping of the sync signals.

What I claim is:

1. A protection circuit for protecting an integrated circuit against voltage transients, comprising:
   a signal input terminal;
   a first source of reference potential;
   conductive means for connecting the terminal to the integrated circuit to be protected;
   a first circuit connected between the conductive means and the first source of reference potential including a pair of coupled opposite conductivity type transistors, a first emitter-base shunt resistor coupled between the emitter and base of one of said transistors, a Zener diode coupled to said transistors, said first circuit protecting the integrated circuit against negative voltage transients more negative than the breakdown voltage of the Zener diode; and
   a second circuit connected between the conductive means and the first source of reference potential including a pair of coupled opposite conductivity type transistors, said second circuit protecting the integrated circuit against positive voltage transients more positive than a threshold voltage that is independent of said Zener diode breakdown voltage.

2. A protection circuit as claimed in claim 1, further comprising a second source of reference potential coupled to said second circuit.

3. A protection circuit as claimed in claim 2, further comprising a diode coupled between said second circuit and said second source.

4. A protection circuit as claimed in claim 1, wherein said first circuit comprises:
   a first NPN transistor having an emitter, a base and a collector, said first emitter-base shunt resistor being coupled to said first NPN transistor;
   a first PNP transistor having an emitter, a base and a collector;
   means connecting the base of the NPN transistor to the collector of the PNP transistor;
   means connecting the base of the PNP transistor to the collector of the NPN transistor;
   means connecting the emitter of the NPN transistor to the conductive means; and
   means connecting the emitter of the PNP transistor to the first source of reference potential.

5. A protection circuit as claimed in claim 4, further comprising a diode having an anode coupled to said first source of reference potential and a cathode coupled to said collector of said first NPN transistor and said base of said first PNP transistor.

6. A protection circuit as claimed in claim 4, further comprising:
   a second source of reference potential, and wherein the second circuit comprises:
   a second PNP transistor having an emitter, a base and a collector;
   a second NPN transistor having an emitter, a base and a collector;
   a second emitter-base resistor shunt coupled to said second NPN transistor;
   means connecting the base of the second NPN transistor to the collector of the second PNP transistor;
   means connecting the collector of the second NPN transistor to the base of the first and second PNP transistors and to the second source of reference potential;

means connecting the emitter of the second PNP transistor to the conductive means; and means connecting the emitter of the second NPN transistor to the first source of reference potential.

7. A protection circuit as claimed in claim 6, further comprising:

a current limiting resistor connected in series with the conductive means between the terminal and the protected integrated circuit; and the emitter of the first NPN transistor and the emitter of the second PNP transistor connected to the end of the current limiting resistor connected to the terminal.

8. A protection circuit as claimed in claim 6, further comprising a diode having a cathode coupled to said second source of reference potential and an anode coupled to said base of said second PNP transistor and to said collector of said NPN transistor.

9. A semiconductor structure for protecting an integrated circuit from negative and positive-going transients, comprising:

a substrate of semiconductor material of a first conductivity type;

a first region of second conductivity type in the substrate at the surface thereof;

a first pair of coupled opposite conductivity type transistors, a first emitter-base shunt resistor coupled to one of said transistors, and a Zener diode and a series resistor coupled to said transistors, formed in the first region, for protection against negative voltage transients more negative than the breakdown voltage of said Zener diode;

a second pair of coupled opposite conductivity type transistors, a second emitter-base shunt resistor coupled to one of said second pair of transistors, also formed in the first region, for protection against positive voltage transients more positive than a threshold voltage that is independent of said Zener diode breakdown voltage;

a signal input terminal formed on the surface of the substrate;

conductive means connecting the terminal to the integrated circuit; and a first source of reference potential;

the first and second pairs of transistors being connected between the conductive means and the source of reference potential.

10. A semiconductor structure as claimed in claim 9, wherein said first pair of opposite conductivity type transistors comprise a first NPN transistor and a first PNP transistor, each transistor, having emitter base, and collector electrodes;

said first region comprising the collector of said NPN transistor and the base of said PNP transistor; and further comprising;

a buried second region of second conductivity type disposed between said substrate and said first region, and comprising the cathode of said Zener diode;

a third region of said first conductivity type formed at the surface of said first region; and comprising said series resistor;

a fourth region of said first conductivity type formed in said first region between said third region and said second region and comprising the anode of said Zener diode;

a fifth region of said second conductivity type formed at the surface of said first region and having two spaced portions divided by a gap portion and comprising the emitter of said first NPN transistor;

a sixth region of said first conductivity type formed between said first and fifth regions and comprising the base of said first NPN transistor, the collector of said first PNP transistor, and said first emitter-base shunt resistor; and a seventh region of said first conductivity type formed at the surface of said substrate and comprising the emitter of said first PNP transistor.

11. A semiconductor structure as claimed in claim 10, wherein said second pair of opposite conductivity type transistors comprise a second NPN transistor and a second PNP transistor, each transistor having emitter, base, and collector electrodes;

said first region comprising the base of said second PNP transistor and the collector of said second NPN transistor; and further comprising an eighth region of said first conductivity type formed at the surface of said first region and comprising the emitter of said second PNP transistor;

a ninth region of said first conductivity type formed at the surface of said substrate and comprising the collector of said second PNP transistor, the base of said second NPN transistor, and said second emitter-base shunt resistor; and a tenth region of said second conductivity type formed at the surface of said ninth region and comprising the emitter of said second NPN transistor.

12. A semiconductor structure as claimed in claim 11, further comprising a first diode having an anode comprising said substrate and a cathode comprising said second region.

* * * * *